United States Patent
Moschiano et al.

(10) Patent No.: US 9,639,420 B2
(45) Date of Patent: May 2, 2017

(54) HIGH PERFORMANCE MEMORY CONTROLLER

(71) Applicant: Micron Technology, Inc., Boise, ID (US)

(72) Inventors: Violante Moschiano, Avezzano (IT); Walter Di Francesco, Avezzano (IT); Luca De Santis, Avezzano (IT); Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 14/657,878

(22) Filed: Mar. 13, 2015

(65) Prior Publication Data

US 2016/0266966 A1    Sep. 15, 2016

(51) Int. Cl.
| | |
|---|---|
| *G11C 29/00* | (2006.01) |
| *G06F 11/10* | (2006.01) |
| *H03M 13/37* | (2006.01) |
| *G11C 29/02* | (2006.01) |
| *G11C 29/52* | (2006.01) |
| *H03M 13/11* | (2006.01) |
| *G11C 29/04* | (2006.01) |

(52) U.S. Cl.
CPC ...... *G06F 11/1068* (2013.01); *G06F 11/1048* (2013.01); *G11C 29/02* (2013.01); *G11C 29/028* (2013.01); *H03M 13/3715* (2013.01); *G11C 29/52* (2013.01); *G11C 2029/0411* (2013.01); *H03M 13/1108* (2013.01); *H03M 13/1111* (2013.01)

(58) Field of Classification Search
CPC . G11C 29/52; H03M 13/1148; G06F 11/1068
See application file for complete search history.

(56) References Cited

U.S. PATENT DOCUMENTS

| | | | |
|---|---|---|---|
| 7,855,916 B2 | 12/2010 | Rao | |
| 8,116,135 B2 | 2/2012 | Aritome | |
| 2012/0240011 A1 | 9/2012 | Helm et al. | |
| 2013/0051141 A1 | 2/2013 | Moschiano et al. | |
| 2013/0176778 A1* | 7/2013 | Chen ................ | G11C 16/06 365/185.03 |
| 2013/0272071 A1 | 10/2013 | Moschiano et al. | |
| 2014/0153338 A1 | 6/2014 | Byeon et al. | |
| 2014/0198569 A1 | 7/2014 | Kim et al. | |

OTHER PUBLICATIONS

Altera Corporation, "NAND Flash Controller," Jun. 30, 2014, pp. 1-104, San Jose, CA.

* cited by examiner

*Primary Examiner* — Sam Rizk
(74) *Attorney, Agent, or Firm* — Fletcher Yoder, P.C.

(57) ABSTRACT

A memory device includes a memory array that includes a buffer data. The memory device also includes a memory controller. The memory controller includes an error correction code (ECC) component. The memory controller further receives a status command and an indication related to the quality of the data to analyze with the ECC component. Based on a status value, the memory controller utilizes one of a plurality of error correction techniques via the ECC component to correct an error (e.g., soft state, calibration, etc.).

24 Claims, 3 Drawing Sheets

HIGH PERFORMANCE MEMORY CONTROLLER

BACKGROUND

Field of the Invention

The present disclosure relates generally to detecting and correcting errors associated with data stored in memory devices. In particular, the present disclosure is related to improving the access time and reliability of memory reads by a memory controller.

Description of the Related Art

Memory devices include internal, semiconductor, integrated circuits and/or external removable devices for use in computers or other electronic devices. Various types of memory exist, including random-access memory (RAM), read only memory (ROM), dynamic random access memory (DRAM), synchronous dynamic random access memory (SDRAM), phase change random access memory (PCRAM), flash memory, and others.

Flash memory devices can be utilized as volatile and/or non-volatile memory and typically include a one-transistor memory cell to allow for high memory densities, high reliability, and low power consumption. Some uses for flash memory include providing memory for solid state drives (SSDs), personal computers, personal digital assistants (PDAs), digital cameras, cellular telephones, portable music players (e.g., MP3 players), movie players, and other electronic devices. In some cases, program code, user data, and/or system data (e.g., basic input/output system (BIOS) data to initialize and test the system hardware components and/or to load a boot loader or an operating system), may be stored in flash memory devices.

Two common types of flash memory array architectures include the "NAND" and "NOR" architectures. A NAND array architecture typically arranges its array of memory cells in a matrix such that the control gates of each memory cell in a "row" of the array are coupled to (and in some cases form) an access line (e.g., a "word line"), with each memory cell of the array being coupled together in series between a common source and a data line (e.g., a "bit line") in a "column" of the array. Additionally, the memory array may be accessed (e.g., for reads and writes to the array) by a NAND flash memory controller. The NAND flash memory and controller work in conjunction in order to increase performance of the NAND memory.

For example, the memory controller may include an error correcting code (ECC) component that allows for correction capability of data accessed via the memory. Various coding techniques, such as, utilization of low-density parity-check (LDPC) codes, trellis coded modulation (TCM), or the like, may be utilized by the ECC component to improve bit error rates (BERs) of the data stored via the flash memory. However, inclusion of these techniques may adversely affect the speed at which data may be retrieved.

DETAILED DESCRIPTION

The present disclosure includes methods, devices, and systems for retrieving data from a memory via a memory controller. In one embodiment, the memory controller retrieves a status indication via a status command in conjunction with a data read of a memory array. This status indication may be compared against one or more thresholds to determine the overall quality the data accompanying the status indication. Based on the results of the comparison of the status indication with the one or more thresholds, read data may be analyzed and corrected by an error correcting code (ECC) component of the memory controller using one of a plurality of preset ECC techniques. The ECC technique may correspond to a probability that the data retrieved will be correctable based on the ECC technique selected, as determined by the comparison of the status indication with the one or more thresholds. The selected ECC technique may be applied to the retrieved data to correct errors therein to allow for more rapid correction of retrieved data from the memory array.

Figure 1:
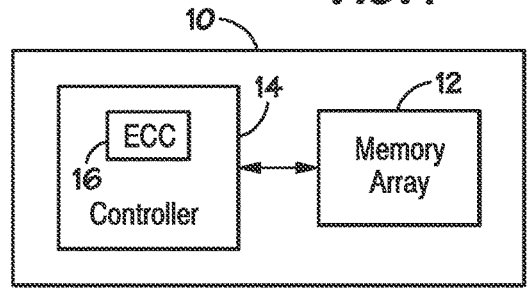
FIG. 1 illustrates a block diagram of an example of a computing system, including at least one memory device, in accordance with an embodiment.

Turning now to the figures, FIG. 1 illustrates a block diagram of a memory device 10. Memory device 10 may include a memory array 12 and a controller 14. The memory array 12 may represent one or more arrays of memory cells, e.g., non-volatile memory cells. In some embodiments, the memory array 12 can be one or more flash memory arrays utilizing, for example, a NAND architecture. However, in other embodiments, the memory array 12 may include RAM, ROM, DRAM, SDRAM, PCRAM, RRAM, or other types of memory.

Access of the memory array 12 may be controlled by controller 14. As illustrated, controller 14 is communicatively coupled to and separate (e.g., on a separate die) from memory array 12. However, in other embodiments, controller 14 may be included on a physical device (e.g., a common die) with memory array 12. In general, the controller 14 is responsible for converting commands and transferring control, address, data and/or other signals between a host device (e.g., a computer, tablet, digital camera, digital recording and/or playback device, mobile telephone, memory card reader, or other digital device coupled to the controller) and the memory array. In this manner, the controller 14 can communicate with the memory array 12 to read, write, and erase data, among other operations.

In some embodiments, the controller 14 may include hardware, for example, an application specific integrated circuit (ASIC) or a processor coupled to a printed circuit board as well as software and/or firmware executable by the ASIC or processor and stored on non-transitory machine readable media, such as memory of the printed circuit board. Additionally, the controller 14 may include an error correction code (ECC) component 16. The ECC component 16 may be implemented via hardware, firmware, software, or a combination thereof (e.g., code stored on non-transitory machine readable media, such as memory of the printed circuit board and executed by the ASIC or processor of the controller 14 or by an ASIC or processor of the ECC component 16). The ECC component 16 may operate to perform error corrections on data transmitted to and/or from the memory array 12 using, for example, low density parity check (LDPC)/trellis code modulation (TCM). In this manner, the ECC component 16 may operate to correct errors in data received by the controller 14. For example, errors in the state of a memory cell due to threshold voltage shift can be corrected by the ECC component 16. Additionally, as will be discussed in greater detail below, the ECC component 16 may be utilized to correct errors based only on hard data. Alternatively, the ECC component 16 may utilize soft data in conjunction with the hard data to correct errors. The type of error correction applied may depend on the number of errors caused by, for example, changing of states of memory cells of the memory array 12 (e.g., changing from state 0 to state 1) between a first sensing operation and a second sensing operation performed on memory cells of the memory array.

Figure 2:
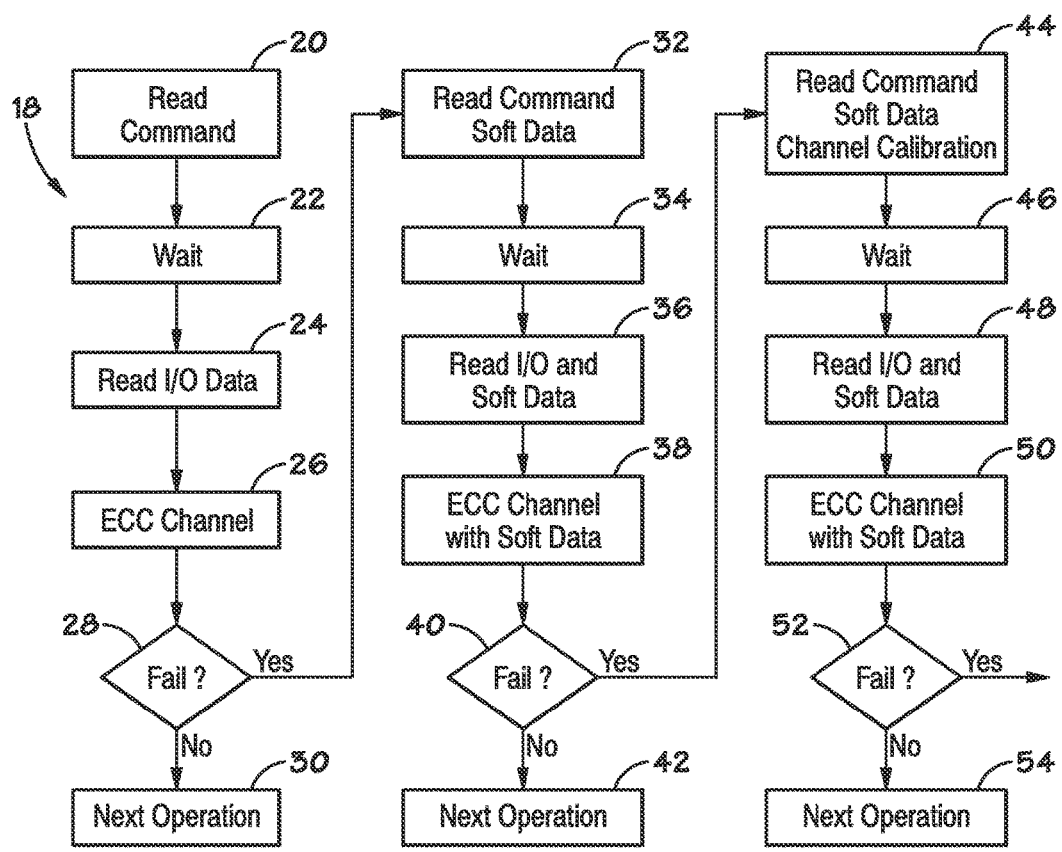
FIG. 2 illustrates a first flow chart of a method to access a memory array of the memory device of FIG. 1, in accordance with an embodiment.

FIG. 2 depicts a flow chart 18 that illustrates accessing of the memory array 12 and applying error correction techniques via the ECC component 16. In step 20, a read command is transmitted to the memory array 12 from the controller 14 to retrieve data from the memory array 12. The read time of the array 12 is illustrated in step 22, whereby the controller 14 may wait a predetermined time for the memory array 12 to access the requested data. In step 24, a read of the requested data is performed by the memory controller 14, allowing for the transfer of the requested data to the controller 14. In step 26, the data that has been read and transmitted to the memory controller 14 is transmitted to the ECC component 16 for processing. If, in step 28, the data is correctable by the ECC component 16 (e.g., if the error correction performed by the ECC component 16 does not result in a failed read of the data by failing to correct faulty values), the valid data may be transmitted to a host device and an additional operation may be undertaken by the memory controller 14 in step 30. If, however, the data is uncorrectable by the ECC component 16 in step 28 (e.g., if the error correction performed by the ECC component 16 results in a failed read of the data by failing to correct faulty values), the memory controller 14 may undertake additional actions.

For example, the memory controller 14 may, in step 32, transmit a read command with a request for soft data to the memory array 12 from the controller 14 to retrieve data from the memory array 12. The read time of the array to 12 to access the requested data and soft data is illustrated in step 34, whereby the controller 14 may wait a predetermined time for access to be completed. In step 36, a read of the requested data and soft data is performed by the memory controller 14, allowing for the transfer of the requested data and soft data to the controller 14. In step 38, the data and soft data that has been read and transmitted to the memory controller 14 is transmitted to the ECC component 16 for processing. If, in step 40, the data is correctable by the ECC component 16 utilizing the soft data (e.g., if the error correction performed by the ECC component 16 does not result in a failed read of the data by failing to correct faulty values), the valid data may be transmitted to a host device and the memory controller 14 may move on to the next operation in step 42. If, however, the data is uncorrectable by the ECC component 16 utilizing the soft data in step 40 (e.g., if the error correction performed by the ECC component 16 results in a failed read of the data by failing to correct faulty values), the memory controller 14 may undertake additional actions.

For example, the memory controller 14 may, in step 44, transmit a read command with a request for soft data to the memory array 12 from the controller 14 to retrieve data from the memory array 12. Part of this read command and soft data request may include a channel calibration determination that allows for estimation and/or correction of read errors caused by the transmission of the data along a data path (channel). This may allow for a more precise read of the data and soft data to occur, since additional errors introduced via the data path (channel) may be minimized and/or eliminated by the channel calibration (e.g., by taking into account and negating channel induced errors by correcting for sources of error, such as noise, introduced by the data channel). Accordingly, a channel calibration value may be generated based upon the channel calibration determination, whereby the channel calibration value may be applied to the read/received data to alleviate channel errors.

The read time of the array 12 to access the requested data and soft data is illustrated in step 46, whereby the controller 14 may wait a predetermined time for access to be completed. In step 48, a read of the requested data and soft data is performed by the memory controller 14, allowing for the transfer of the requested data and soft data to the controller 14. In step 50 the data and soft data that has been read and transmitted to the memory controller 14 is transmitted to the ECC component 16 for processing. If, in step 52, if the data is correctable by the ECC component 16 utilizing the soft data (e.g., if the error correction performed by the ECC component 16 does not result in a failed read of the data by failing to correct faulty values), the valid data may be transmitted to a host device and an additional operation may be undertaken by the memory controller 14 in step 54. If, however, the data is uncorrectable by the ECC component 16 utilizing the soft data in step 52 (e.g., if the error correction performed by the ECC component 16 results in a failed read of the data by failing to correct faulty values), the memory controller 14 may undertake additional actions, such as additional reads and/or generation of an indication that the data is unrecoverable.

In some embodiments, the technique described above with respect to flow chart 18 may be characterized as having three error correction stages. Stage one may include steps 20, 22, 24, 26, and 28. Stage two may include steps 32, 34, 36, 38, and 40, while stage three may include steps 44, 46, 48, 50, and 52. Additionally, each stage may take a predetermined amount of time to complete. For example, steps 20 and 22 may take approximately 50 μsec, step 24 may take approximately 50 μsec, and step 26 may take approximately 50 μsec for a total of approximately 150 μsec to complete a stage one read. Likewise, steps 32 and 34 may take approximately 50 μsec, step 36 may take approximately 200 μsec (to complete a read of both hard state and soft state data), and step 38 may take approximately 50 μsec for a total of 300 μsec to complete a stage two read. However, a stage two read is not completed until a stage one read has been completed. Accordingly, the overall time to complete a stage two read includes the time to complete a stage one read (approximately 150 μsec) and the processing time to complete a stage two read (approximately 300 μsec) for a total time of approximately 450 μsec.

Similarly, steps 44 and 46 may take approximately 150 μsec (to allow for channel calibration to occur), step 48 may take approximately 200 μsec (to complete a read of both hard state and soft state data), and step 50 may take approximately 50 μsec for a total of 400 μsec to complete a stage three read. However, a stage three read is not completed until a stage one read and a stage two read have been completed. Accordingly, the overall time to complete a stage three read includes the time to complete a stage one and a stage two read (approximately 450 μsec) as well as the processing time to complete a stage three read (approximately 400 μsec) for a total time of approximately 850 μsec. In some embodiments, these processing times for stage two and/or stage three reads may negatively impact the read time of the memory array 12, which may reduce the performance of the host device. Accordingly, a second embodiment for accessing the memory array 12 and applying error correction techniques via the ECC component 16 with reduced read times is described below with respect to FIG. 3.

Figure 3:
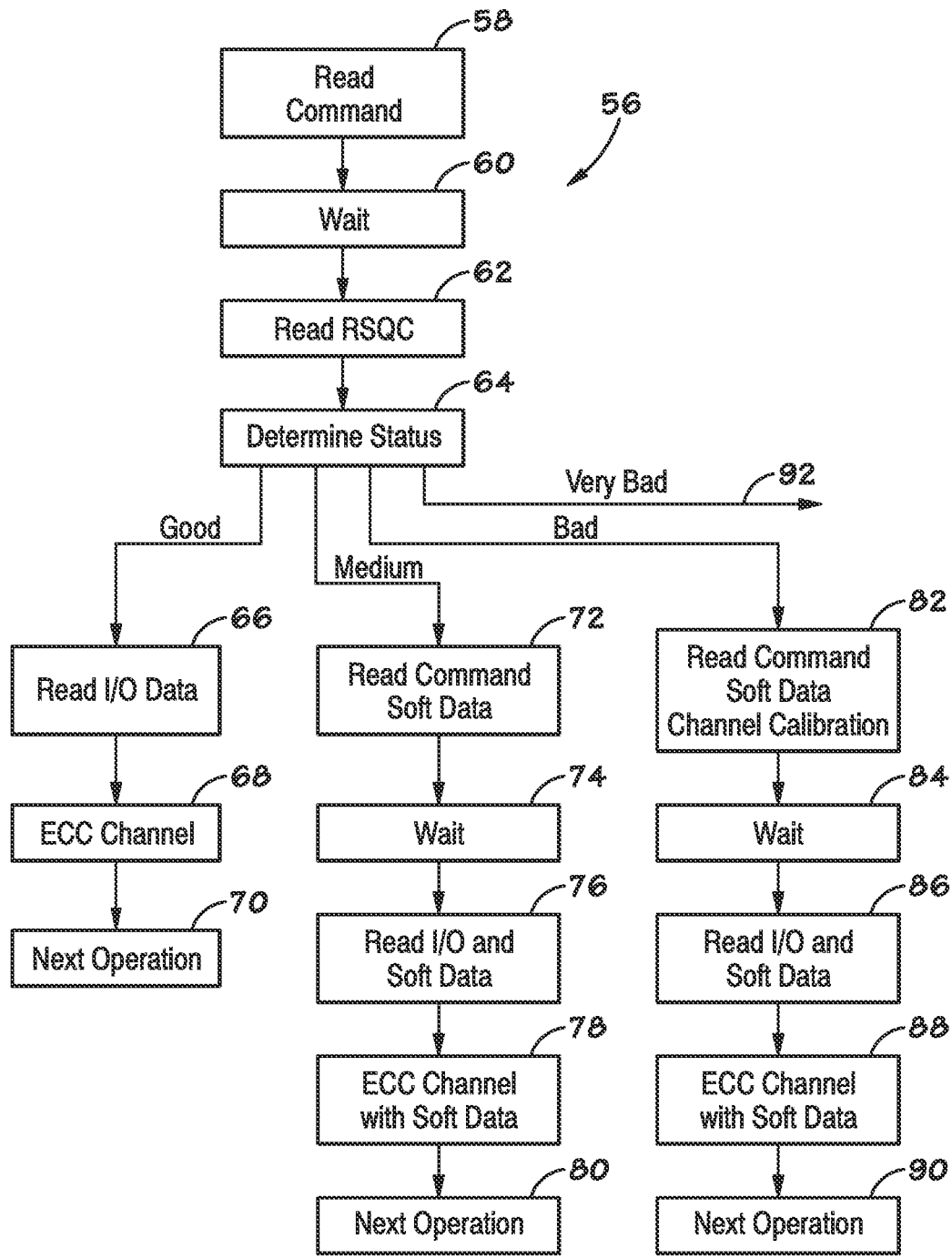
FIG. 3 illustrates a second flow chart of a method to access the memory array of the memory device of FIG. 1, in accordance with an embodiment.

FIG. 3 depicts a flow chart 56 that illustrates a second technique to access the memory array 12 and apply error correction techniques via the ECC component 16 of the memory controller 14. As will be discussed in greater detail below, the flow chart 56 includes the use of a read quality status command (RSQC). The RSQC may indicate whether there is a good probability that a stage one read will allow for a correct read to occur, whether there is a medium probability that a stage one read will allow for a correct read to occur, whether there is a low probability that a stage one read will allow for a correct read to occur, or whether there is a very low probability that a stage one read will allow for a correct read to occur. Thus, the RSQC will check (internal to the memory array 12) the quality of the data prior to any pass through the ECC component 16 of the memory controller 14. Based on the RSQC, the ECC component 16 may perform one of the stage one, stage two, or stage three reads.

The initial step in flow chart 56 of FIG. 3 includes the memory controller 14, in step 58, transmitting a read command from the controller 14 to retrieve data from the memory array 12. The read time of the array 12 is illustrated in step 60 whereby the controller 14 may wait a predetermined time for the memory array 12 to access the requested data. In step 62, the controller 14 may read a RSQC transmitted from the memory array 12. As previously discussed, the RSQC may represent an internal data validation result that indicates whether there is a good probability that a stage one read will allow for a correct read to occur, whether there is a medium probability that a stage one read will allow for a correct read to occur, whether there is a low probability that a stage one read will allow for a correct read to occur, or whether there is a very low probability that a stage one read will allow for a correct read to occur. In one embodiment, the read of the RSQC in step 62 may be subsequent to a RSQC request that is part of the read command in step 58. Alternatively, the read of the RSQC in step 62 may be subsequent to a RSQC request separate from the read command in step 58 (e.g. a separate command issued from the memory controller as part of step 62).

In step 64, the controller 14 may determine the status of the RSQC received in step 62. In one embodiment, the controller 14 may compare a value of the RSQC against predetermined set values stored in the controller 14 to determine the status of the RSQC. For example, a RSQC having a first value may indicate a good probability that a stage one read will allow for a correct read of data from the memory array 12. Similarly, a RSQC having a second value may indicate a medium probability that a stage one read will allow for a correct read of data from the memory array 12. Likewise, a RSQC having a third value may indicate a low probability that a stage one read will allow for a correct read of data from the memory array 12. Finally, a RSQC having a fourth value may indicate a very low probability that a stage one read will allow for a correct read of data from the memory array 12. It should be noted that the present examples are illustrative only, and the RSQC may include fewer or a greater number of values corresponding to read stages of the memory array 12.

If, in step 64, the memory controller 14 determines that the RSQC indicates that there is a good probability that a stage one read will allow for a correct read of data from the memory array 12, step 66 is invoked. In step 66, a read of the requested data is performed by the memory controller 14, allowing for the transfer of the requested data to the controller 14. In step 68, the data that has been read and transmitted to the memory controller 14 is transmitted to the ECC component 16 for processing. This data is corrected by the ECC component 16 in step 68 and the valid data may be transmitted to a host device. Finally, an additional operation may be undertaken by the memory controller 14 in step 70.

If, in step 64, the memory controller 14 determines that the RSQC indicates that there is a medium probability that a stage one read will allow for a correct read of data from the memory array 12, step 72 is invoked. In step 72, the memory controller 14 may transmit a read command with a request for soft data to the memory array 12 from the controller 14 to retrieve data from the memory array 12. The read time of the array to 12 to access the requested data and soft data is illustrated in step 74, whereby the controller 14 may wait a predetermined time for access to be completed. In step 76, a read of the requested data and soft data is performed by the memory controller 14, allowing for the transfer of the requested data and soft data to the controller 14. In step 78 the data and soft data that has been read and transmitted to the memory controller 14 is transmitted to the ECC component 16 for processing. This data is corrected by the ECC component 16 in step 78 utilizing the requested data (e.g., hard data) and the soft data from step 76, and the valid data may be transmitted to a host device. Finally, an additional operation may be undertaken by the memory controller 14 in step 80.

Returning to step 64, if the memory controller 14 determines that the RSQC indicates that there is a low probability that a stage one read will allow for a correct read of data from the memory array 12, step 82 is invoked. In step 82, the memory controller 14 may transmit a read command with a request for soft data to the memory array 12 from the controller 14 to retrieve data from the memory array 12. Part of this read command and soft data request may include a channel calibration determination that allows for generation of a channel calibration value to be applied to the received data to correct read errors caused by the transmission of the data along a data path (channel) to allow for a more precise read of the data and soft data to occur by, for example, taking into account and negating channel induced errors by correcting for sources of error, such as noise, introduced by the data channel.

The read time of the array to 12 to access the requested data and soft data is illustrated in step 84, whereby the controller 14 may wait a predetermined time for access to be completed. In step 86, a read of the requested data and soft data is performed by the memory controller 14, allowing for the transfer of the requested data and soft data to the controller 14. In step 88 the data and soft data that has been read and transmitted to the memory controller 14 is transmitted to the ECC component 16 for processing. This data is corrected by the ECC component 16 in step 88 utilizing the requested data (e.g., hard data) and the soft data from step 86, and the valid data may be transmitted to a host device. Finally, an additional operation may be undertaken by the memory controller 14 in step 90.

Lastly, if the memory controller 14, in step 64, determines that the RSQC indicates that there is a very low probability that a stage one read will allow for a correct read of data from the memory array 12, step 92 is invoked. Step 92 may include additional reads and/or generation of an indication that the requested data from memory 12 is unrecoverable.

In some embodiments, the technique described above with respect to flow chart 56 may be characterized as having three error correction stages. Stage one may include steps 58, 60, 62, 64, 66, and 68. Stage two may include steps 58, 60, 62, 64, 72, 74, 76, and 78, while stage three may include steps 58, 60, 62, 64, 82, 84, 86, and 88. Additionally, each stage may take a predetermined amount of time to complete. For example, steps 58 and 60 may take approximately 50 μsec to complete, while steps 62 and 64 may take a negligible amount of time to complete, as the read of the RSQC and determination of the status are faster processes than, for example, the wait time to access data in step 60. The read of the requested data in step 66 may take approximately 50 μsec, while the data correction by the ECC component 16 in step 68 may take approximately 50 μsec for a total of approximately 150 μsec to complete a stage one read. Likewise, steps 72 and 74 may take approximately 50 μsec to complete, while step 76 may take approximately 200 μsec (to complete a read of both hard state and soft state data), and step 78 may take approximately 50 μsec for a total of 300 μsec to complete a stage two read. However, a stage two read is not initiated until steps 58, 60, 62, and 64 have been completed. Accordingly, the overall time to complete a stage two read includes the time to complete steps 58, 60, 62, 64 (approximately 50 μsec) and the processing time to complete a stage two read (approximately 300 μsec) for a total time of approximately 350 μsec.

Similarly, steps 82 and 84 may take approximately 150 μsec (to allow for channel calibration to occur), step 86 may take approximately 200 μsec (to complete a read of both hard state and soft state data), and step 88 may take approximately 50 μsec for a total of 400 μsec to complete a stage three read. However, a stage three read is not initiated until steps 58, 60, 62, and 64 have been completed. Accordingly, the overall time to complete a stage three read includes the time to complete steps 58, 60, 62, 64 (approximately 50 μsec) as well as the processing time to complete a stage three read (approximately 400 μsec) for a total time of approximately 450 μsec.

Figures 4, 5, 6:
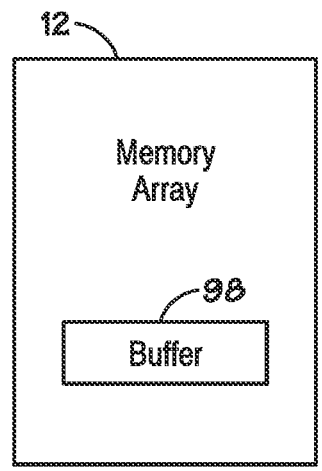
FIG. 4 illustrates a table showing the use of hard state and soft state data to determine the output of a memory cell of the memory array of FIG. 1, in accordance with an embodiment.
FIG. 5 is a table showing soft bit determination based on a number of neighboring aggressor programmed memory cells to a memory cell of the memory array of FIG. 1, in accordance with an embodiment.
FIG. 6 illustrates a block diagram of the memory array of FIG. 1, in accordance with an embodiment.

Thus, the technique described above with respect to flow chart 56 of FIG. 3 may allow for faster processing times for both stage two and stage three reads, relative to the technique described above with respect to flow chart 18 of FIG. 2. Accordingly, by implementing the technique described above with respect to flow chart 56, overall read performance of the memory array 12, especially when errors are to be corrected, may be increased (since the time to complete the error correction operation is decreased). Additional benefits may include reduced traffic on the bus coupling the controller 14 to the memory array 12. Moreover, as discussed above, the RSQC may be utilized to streamline error correction of data read from the memory array. FIGS. 4-6 below detail one manner for the generation and storage of the RSQC prior to transmission to the memory controller 14.

FIG. 4 illustrates a table 94 including hard bits of data and soft bits of data. In one embodiment, the hard bits of data may be generated via a method of using a measured threshold voltage to determine possible data state outputs. For example, several "hard bits" of data are determined by evaluating a threshold voltage at which a memory cell of the memory array 12 being read conducts. The hard bit data may change as threshold voltage increases, such that the higher the threshold voltage becomes, the fewer hard bits are set to a logical one output value. Moreover, in some embodiments, the hard bits may not be a direct measurement of a voltage ramp, but instead may correspond to various voltage values on the voltage ramp within the region of likely observed threshold values considering the influence of factors such as neighboring programmed memory cells and other variables.

The hard bits, determined as discussed above, can be utilized in conjunction with "soft bits" (e.g., bits that represent a likelihood that programmed memory states of memory cells adjacent to a particular memory cell influence the programmed state of the particular memory cell) as the soft data described above. The table 94 in FIG. 4 illustrates one example of this technique. The soft bits of table 94 represent a number of neighboring memory cells of the memory array 12 that are in a programmed state, such that they may inadvertently raise the threshold voltage of a cell of the memory array 12 being read. In one embodiment, the soft bits may be determined via a read of the potential aggressor memory cells (e.g., cells likely to influence a state of a cell being read based on their proximity to the cell being read, as described below in paragraph 35), such that data states of the potential aggressor cells are converted into soft bits using a buffer of the memory array 12. For example, in one embodiment, the read states of any aggressor cell(s) can be either converted into the soft bits using a buffer (e.g., in the case of dual side of full post-compensation) or used as the soft bits (e.g., single side post-compensation), and merged in a page buffer with the hard bits.

Typically, cells that are physically closest to the memory cell being read are viewed as having a greater influence or aggression in interfering with the cell being read than cells that are farther away. In the present discussion, cells that are diagonal from the cell being read are therefore not considered in this example, while cells that neighbor vertically or horizontally are considered as potential aggressor memory cells. FIG. 5 includes a table 96 that illustrates how the number of neighboring programmed aggressor memory cells may be encoded, with 11 representing no neighboring vertical or horizontal programmed memory cells, 10 representing one neighboring vertical or horizontal programmed memory cell, 01 representing two neighboring vertical or horizontal programmed memory cells, and 00 representing three or four neighboring vertical and horizontal programmed memory cells. Accordingly, the "output" column of FIG. 5 may correlate to which of the four hard bits read during a read operation will best represent the true data state of the memory device (as based on the number of neighboring aggressor memory cells as encoded by the soft bits 5 and 6, as shown in FIG. 4).

Returning again to FIG. 4, the table 94 illustrates several example hard bit readings for various memory cells 98, 100, 102, and 104 shown along with corresponding soft bit data and output data. With respect to memory cell 98, the four hard bits are all ones, indicating that the output will be a one irrespective of the soft bit values. Turning to the soft bits of memory cell read 98, the values of bits 5 and 6 are both one, which corresponds to low aggressor interference from neighboring memory cells (FIG. 5), and indicates that hard bit 3 from table 96 should be used to determine the output value.

Similarly, the soft bits of the flash memory cell read at 100 are both ones, also indicating that hard bit 3 should be used to determine the data state. At 100, this results in an output of zero, as only one hard bit zero is set to a one value. Memory cell read 102 has two hard bits that are one and two hard bits that are zero, and so the output will be a zero if there are one or fewer neighboring programmed aggressor memory cells, and will be a one if there are two or more neighboring programmed memory cells. Here, there is one neighboring programmed memory cell, as reflected by the soft bits 10 and corresponding table 96, so hard bit two (which has a zero value) is used to provide the output. Additionally, with respect to the memory cell read at 104, we can see that with no neighboring aggressor cell influence the output would be a zero as reflected by hard bit three. But the presence of any neighboring aggressor cells indicates that the output should perhaps be a one, with increasing probability as the number of neighboring aggressor memory cells increases. Soft bits of 00 in this example would therefore indicate a relatively strong probability that what may have been read as a zero assuming no influence from neighboring aggressor memory cells should be an output value of one, providing an error correction circuit with information that may help resolve errors that could otherwise not be corrected. In some embodiments, threshold voltage tracking may be used to estimate a probability or likelihood of influence from neighboring memory cells, and can be employed to provide the error correction.

In some embodiments, the soft data described above may be transmitted to a buffer (e.g. a page buffer) of the memory array 12. FIG. 6 illustrates one embodiment of the memory array 12 that includes the buffer 98. Buffer 98 may store, for example, the hard and soft bits of table 94, the soft bits of table 94, and/or the output bits of table 96. In some embodiments, the stored soft bits of table 94 or the stored output bits of table 96 may be utilized to generate the RSQC. For example, the stored soft bits of table 94 or the stored output bits of table 96 may be counted and a value associated with the count may be stored as the RSQC. For example, the number of weak soft bits (e.g., 00 or 01 of table 94 or output bit 0 or 1) in a page stored in buffer 98 may be counted. If the count is, for example, less than (or equal to) a first threshold value (e.g., 5, 10, 15, 20, or another value), then the RSQC may include a first value that indicates that there is a good probability that a stage one read will allow for a correct read to occur. If the count is, for example, greater than the first threshold value (e.g., 5, 10, 15, 20, or another value) but less than (or equal to) a second threshold value greater than the first threshold value (e.g., 10, 20, 30, 40 50, 60, 70, 80, 90, 100, or another value), then the RSQC may include a second value that indicates that there is a medium probability that stage one read will allow for a correct read to occur. If the count is, for example, greater than the second threshold value (e.g., 10, 20, 30, 40 50, 60, 70, 80, 90, 100, or another value) but less than (or equal to) a third threshold value greater than the second threshold value (e.g., 50, 100, 150, or another value), then the RSQC may include a third value that indicates that there is a low probability that stage one read will allow for a correct read to occur. Additionally, if the count is, for example, greater than the third threshold value (e.g., 50, 100, 150, or another value), then the RSQC may include a fourth value that indicates that there is a low probability that stage one read will allow for a correct read to occur. In this manner, the RSQC may be generated with an indication that may be used by the memory controller to determine which step (e.g., 66, 72, 82, or 92) to take in the process illustrated in FIG. 3. Moreover, as previously noted, use of the RSQC in this manner may allow for accelerated reads of the memory array while maintaining error correction capability.

While the presently disclosed systems and techniques may be susceptible to various modifications and alternative forms, specific embodiments have been shown by way of example in the drawings and have been described in detail herein. However, it should be understood that the disclosed systems and techniques are not intended to be limited to the particular forms disclosed. Rather, the disclosed systems and techniques are provided to cover all modifications, equivalents, and alternatives falling within the spirit and scope of the following appended claims.

What is claimed is:

1. A memory device, comprising:
a memory array comprising a buffer configured to store an indicator of quality of data stored in the memory array; and
a memory controller comprising an error correction code (ECC) component, wherein the memory controller is configured to:
receive an indication related to the indicator;
transmit a particular read command from a set of different types of read commands based on the indicator to read the data stored in the memory array; and
utilize one of a plurality of error correction techniques via the ECC component consistent with the particular read command to correct an error in the data based upon the indication.

2. The memory device of claim 1, wherein the memory array is configured to generate the indicator.

3. The memory device of claim 1, wherein the memory array is configured to utilize soft data of the data stored in the memory array to generate a count.

4. The memory device of claim 3, wherein the memory array is configured to generate the indication based upon a comparison of the count with at least one threshold value.

5. The memory device of claim 1, wherein the memory controller is configured to select a first error correction technique of the plurality of error correction techniques when the indication comprises a first value.

6. The memory device of claim 5, wherein the ECC component is configured to apply a low density parity check as the first error correction technique.

7. The memory device of claim 5, wherein the memory controller is configured to select a second error correction technique when the indication comprises a second value, wherein the second error correction technique utilizes soft data of the data stored in the memory array.

8. The memory device of claim 7, wherein the memory controller is configured to apply a channel calibration value to the data when the indication comprises a third value.

9. A memory controller, comprising:
an input to receive data and an indication related to soft data stored in a memory array, wherein the data is received in response to a particular read command from a set of different types of read commands transmitted based on the indicator; and
an error correction code (ECC) component configured to apply one of a plurality of error correction techniques consistent with the particular read command to correct an error in the data based upon the indication.

10. The memory controller of claim 9, wherein the ECC component is configured to receive the soft data from the input.

11. The memory controller of claim 10, wherein the ECC component is configured to utilize the soft data to correct the error in the data.

12. The memory controller of claim 9, wherein the memory controller is configured to generate a channel calibration value to be applied to the data based upon the indication.

13. The memory controller of claim 9, wherein the memory controller is configured to generate an indication that the data is unreadable based upon the indication.

14. A non-transitory, machine-readable medium, comprising instructions when executed by a processor configured to:
receive an indication of quality of data stored in a memory array;
compare the indication with at least one preset value;
determine which of a plurality of error correction techniques to implement to correct an error in data received from the memory array based on the comparison;
generate a particular read command from a set of different types of read commands based on the comparison to read the data stored in the memory array; and
generate an indication of which of the plurality of error correction techniques to implement consistent with the particular read command to correct the error in the data received from the memory array based on the comparison.

15. The non-transitory, machine-readable medium of claim 14, wherein the instructions are configured to generate the particular read command to read the data and soft data related to the data.

16. The non-transitory, machine-readable medium of claim 14, wherein the instructions are configured to generate a channel calibration value and the particular read command to read the data and soft data related to the data.

17. A method, comprising:
transmitting a read command to access data stored in a memory array;
waiting a predetermined amount of time;
receiving an indication related to quality of the data;
determining which second read command from a set of different types of read commands to transmit to read the data stored in the memory array based on the indication; and
determining which error correction technique of a plurality of error correction techniques consistent with the particular read command to apply to the data based upon the indication.

18. The method of claim 17, comprising:
receiving the data from the memory array;
applying the error correction technique to correct at least one error in the data.

19. The method of claim 17, comprising transmitting the second read command with a read request to access soft data related to the data based upon the indication.

20. The method of claim 19, comprising applying the error correction technique to correct at least one error in the data utilizing the soft data.

21. The method of claim 17, comprising generating a channel calibration value to be applied to the data based upon the indication.

22. A device, comprising:
a memory controller, configured to:
receive an indication related to quality of data to be accessed from a memory array;
determine which error correction technique of a plurality of error correction techniques to apply to the data consistent with a particular read request based upon the indication; and
generate the particular read request of the data from a set of different types of read requests of the data of the memory array based on the determination.

23. The device of claim 22, wherein the memory controller is configured to generate the particular read request of the data based on a comparison of the indication with a threshold.

24. The device of claim 22, wherein the memory controller is configured to generate the particular read request of the data and a channel calibration value based on a comparison of the indication with a threshold.

* * * * *